United States Patent [19]

Sano et al.

[11] Patent Number: 4,803,431
[45] Date of Patent: Feb. 7, 1989

[54] METHOD FOR IMAGING THREE-DIMENSIONAL MOVING OBJECT

[75] Inventors: Koichi Sano, Sagamihara; Shinichi Sato, Yokohama; Tetsuo Yokoyama, Tokyo; Hideaki Koizumi, Katsuta, all of Japan

[73] Assignee: Hitachi, Ltd., Tokyo, Japan

[21] Appl. No.: 75,947

[22] Filed: Jul. 21, 1987

[30] Foreign Application Priority Data

Jul. 25, 1986 [JP] Japan ................................. 61-173643

[51] Int. Cl.$^4$ .............................................. G01R 33/20
[52] U.S. Cl. ..................................... 324/306; 324/309; 128/653
[58] Field of Search ............... 324/307, 309, 312, 306; 128/653

[56] References Cited

U.S. PATENT DOCUMENTS 4,602,641 7/1986 Feinberg .............................. 324/306
4,609,872 9/1986 O'Donnell ........................... 324/306

OTHER PUBLICATIONS

Moran et al., "Verification and Evaluation of Internal Flow and Motion", Radiology, vol. 154, No. 2, Feb. 1985.
Sano et al., "Phase Correction Technique in MRI", General Meeting of the Institute of Electronics and Communication Engineers of Japan 1985.

Primary Examiner—John Chapman
Assistant Examiner—Kevin D. O'Shea
Attorney, Agent, or Firm—Antonelli, Terry & Wands

[57] ABSTRACT

A method for imaging a three-dimensional moving object is disclosed, by which a static magnetic field, gradient magnetic fields and high frequency magnetic field are generated; a nuclear magnetic resonance signal due to them coming from an examined object is detected; and various sorts of operations including image reconstruction are effected, starting from the signal thus detected so that the speed of moving object moving in any three-dimensional direction, independently of the slice direction, can be measured by one imaging.

4 Claims, 4 Drawing Sheets

FIG. 2

| MEASURED SIGNAL / GRADIENT MAGNETIC FIELD | FIRST ECHO | SECOND ECHO | THIRD ECHO |
|---|---|---|---|
| Gz | ◯ | θz | ◯ |
| Gy | ◯ | ◯ | θy |
| Gx | θx | ◯ | ◯ |
| TOTAL | θx | θz | θy |

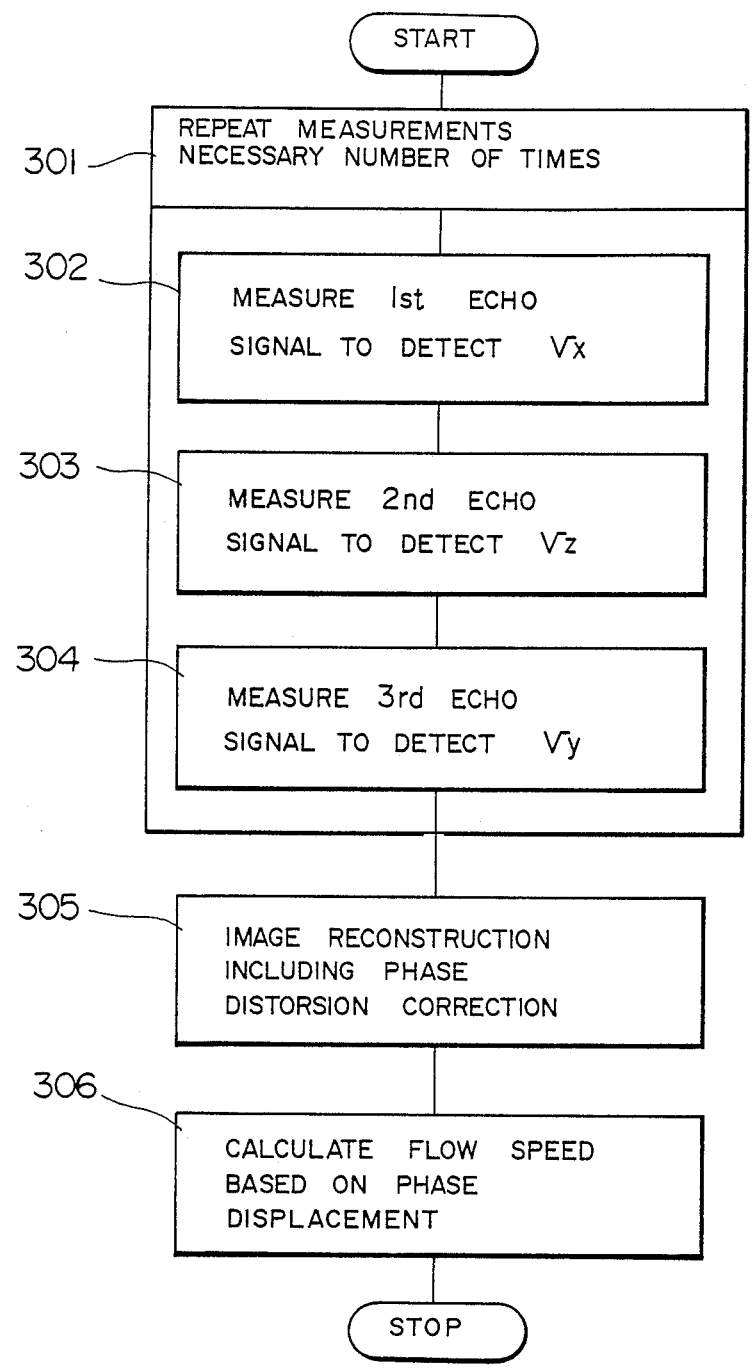

METHOD FOR IMAGING THREE-DIMENSIONAL MOVING OBJECT

BACKGROUND OF THE INVENTION

This invention relates to a tomographic device using nuclear magnetic resonance (NMR) phenomena and in particular to techniques for imaging the speed of blood flow in a body.

The principle of the imaging of blood flow consists in applying a gradient magnetic field which has no influences on still standing substances but influences only moving substances, in the direction of the flow and adding various phase information thereto, depending on the speed thereof in order to measure it. A gradient magnetic field G is applied thereto at a point of time $\tau_1$ in the direction of the blood flow and the inverted gradient magnetic field $(-G)$ is applied thereafter at a point of time $\tau_2$. The inverted gradient magnetic field means a magnetic field, whose magnitude is not changed and only whose sign is inverted.

Since still standing substances don't move, they feel magnetic fields, whose magnitude is not changed and whose sign is inverted, at points of time $\tau_1$ and $\tau_2$. Therefore their influences are cancelled by each other and the substances return to their initial state. On the other hand, since the blood moves, it feels different magnetic fields at the points of time $\tau_1$ and $\tau_2$ and their influences are not cancelled, which gives rise to variations in the phase of the spin.

Usually the perpendicular direction to the slice is called the z-direction, the direction of the gradient magnetic field for reading-out, which is the horizontal direction of the image, the x-direction, and the phase-encoded direction, which is the vertical direction of the image, the y-direction. Hereinbelow the principle of the method for imaging three-dimensional moving liquid will be explained, referring to these x, y and z directions.

The combination of the two gradient magnetic fields described above is called a flow encoded pulse, which is used necessarily for the blood measurement using the phase angle.

A method for measuring the blood flowing in the x, y or z direction by using the phase angle is reported e.g. "Verification and Evaluation of Internal Flow and Motion" by R. Moran et al., Radiology, Volume 154, Number 2, pp. 433-441, Feb. 1985.

According to the prior art techniques stated above, the direction of the blood flow, which can be measured exactly by one imaging is restricted to either one of the x, y and z directions.

However, since the direction of the blood flow is generally not known, the components thereof should be measured in the three directions, i.e. x-, y- and z-directions and thus the imaging must be repeated necessarily three times.

Since one imaging by means of a nuclear magnetic resonance imaging device takes 2 to 20 minutes, it is desirable to reduce the number of imagings from the view points of the problem provoked by positional displacements due to movements of the patient during one imaging and the throughput.

SUMMARY OF THE INVENTION

The object of this invention is to provide a method to measure the speed of the blood flow in a vein directed in an arbitrary direction by one imaging.

In order to achieve the above object, basically a multiple-echo signal is utilized. A multiple-echo signal is a signal, which is obtained by applying a 180° pulse after a measurement of a first signal and by measuring again its echo. If the 180° pulse is applied a plurality of times, signals as many as the number of applications can be observed. However the echo signal has a lower SN ratio with increasing repetition number and practically it is about up to the third echo signal that can be used. Further, because of influences of the transverse relaxation time, intensities of images reproduced by different echo signals are different little by little. However, since there are no variations concerning phase information, they can be used for measuring the speed of the blood flow by using the phase.

BRIEF DESCRIPTION OF THE DRAWINGS

FIG. 2 is a scheme indicating the relation between the measured echo signal and the direction of the blood flow which can be measured;

FIG. 4 is a flow chart indicating the treatment procedure for realizing this invention.

DESCRIPTION OF THE PREFERRED EMBODIMENTS

Figure 1:
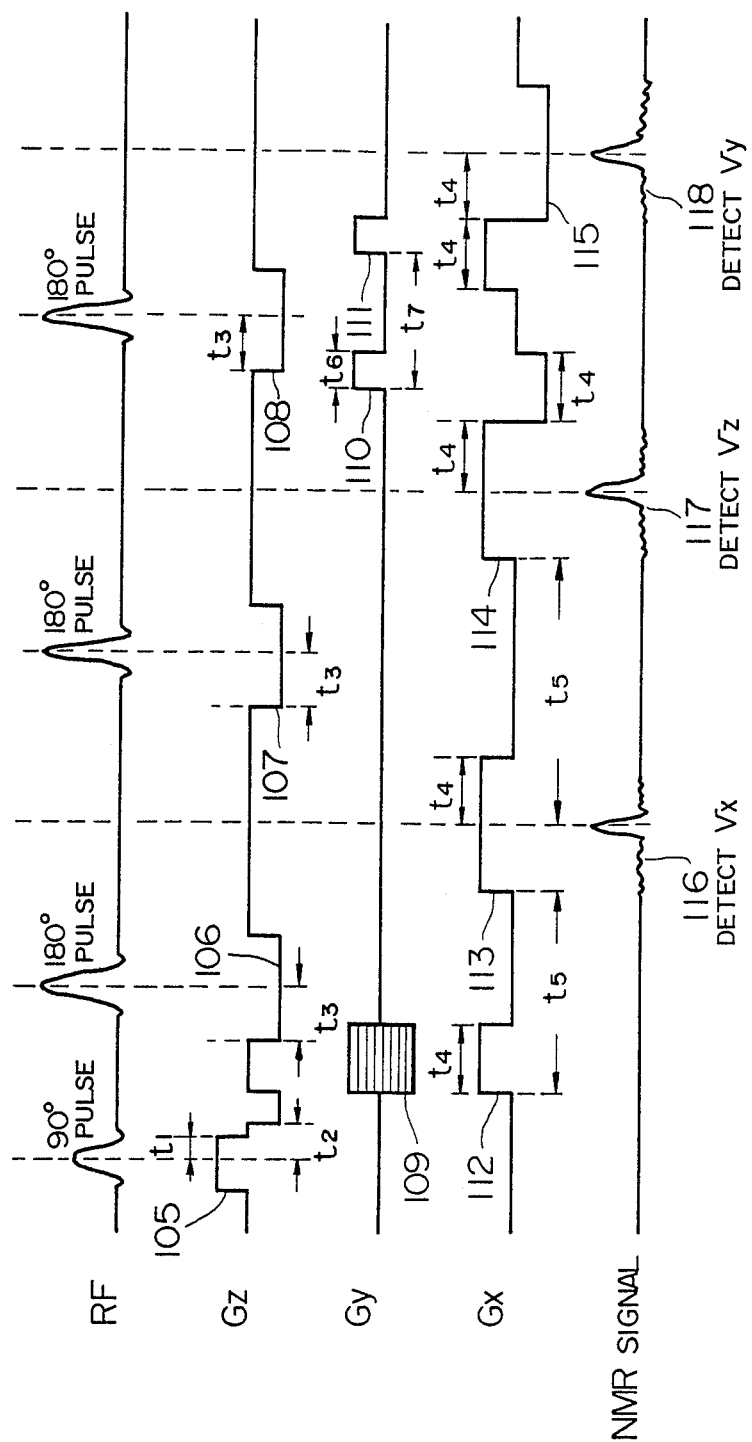
FIG. 1 shows a pulse sequence illustrating an example of the imaging procedure according to this invention.

FIG. 1 shows an example of the pulse sequence for imaging. In the figure, RF indicates a high frequency pulse train for exciting hydrogen spin; $G_z$ a gradient magnetic field used for the selection of the slice and the measurement of the component of the flow speed in the z-direction; $G_y$ a gradient magnetic field used for the separation of the position in the y-direction and the measurement of the component of the flow speed in the y-direction; $G_x$ a gradient magnetic field used for the separation of the position in the x-direction and the measurement of the component of the flow speed in the x-direction; NMR signal the measured signal; $v_x$ the speed component in the x-direction contained in the first echo signal 116; $v_z$ the speed component in the z-direction contained in the second echo signal 117; and $v_y$ the speed component in the y-direction contained in the third echo signal 118.

The flow encoded pulses contained in the first echo signal 116 include 3 sorts of information, i.e. (i) a pair of the first halves of $G_x$ 112 and $G_x$ 113, (ii) $G_z$ 105, and (iii) $G_z$ 106.

At this time, variations in the phase by the flow encoded pulses can be represented as follows;

$$
\begin{aligned}
&\text{(i)} \quad \theta_x = 0.36\, v_0 v_x G_x t_4 t_5 \\
&\text{(ii)} \quad \theta_z = 0.36\, v_0 v_z G_z t_1 t_2 \\
&\text{(iii)} \quad -\theta_z = 0.36\, v_0 v_z G_z t_3 t_3
\end{aligned} \tag{1}
$$

where $v_o$ represents the resonance frequency and $t_1$-$t_5$ are periods of time indicated in FIG. 1.

The variations in the phase due to the flow encoded pulse $G_z$ 105 are cancelled by the flow encoded pulse $G_z$ 106 of inverse characteristics. Consequently only phase variations $\theta_x$ are produced by the component of the flow speed in the x-directions due to influences of $G_x$ 112 and 113, which are encoded pulses in the x-direction. Finally the following result is obtained.

$$\left.\begin{array}{ll} x\text{-direction:} & \theta_x \\ y\text{-direction:} & 0 \\ z\text{-direction:} & \theta_z - \theta_z = 0 \end{array}\right\} \quad (2)$$

In this way, since the phase variations $\theta_x$ in the x-direction can be measured, the speed component $v_x$ can be obtained by using (i) of the Eq. (1) stated above.

The flow encoded pulses contained in the second echo signal 117 include 2 sorts of information, i.e. (i) the second half of $G_x$ 113 and the first half of $G_x$ 114 and (ii) $G_z$ 107. Variations in the phase at this time can be represented as follows:

$$\left.\begin{array}{ll} \text{(i)} & -\theta_x = 0.36\, v_0 v_x G_x t_4 t_5 \\ \text{(ii)} & \theta_z = 0.36\, v_0 v_z G_z t_3 t_3 \end{array}\right\} \quad (3)$$

Phase variations of $-\theta_x$ are produced by the flow encoded pulses in the x-direction Gx 113 and 114. However, since phase variations of $\theta_x$ have been produced by the flow encoded pulse of the first stage, as the result phase variations are zero. In the z-direction phase variations $\theta_z$ are produced by the flow encoded pulse $G_z$ 107 and finally the following result can be obtained.

$$\left.\begin{array}{ll} x\text{-direction:} & \theta_x - \theta_x = 0 \\ y\text{-direction:} & 0 \\ z\text{-direction:} & 0 + \theta_z = \theta_z \end{array}\right\} \quad (4)$$

In this way, since the phase variations $\theta_z$ in the z-direction can be measured, the speed component $v_z$ can be obtained by using (ii) of the Eq. (3) stated above.

The flow encoded pulses contained in the third echo signal 118 include 3 sorts of information, i.e. the second half of $G_x$ 114 and the first half of $G_x$ 115, (ii) $G_y$ 110 and $G_y$ 111, and (iii) $G_z$ 108. Variations in the phase at this time can be represented as follows:

$$\left.\begin{array}{ll} \text{(i)} & 0 = 0.36\, v_0 v_x G_x t_4{}^2 - 0.36\, v_0 v_x G_x t_4{}^2 \\ \text{(ii)} & \theta_y = 0.36\, v_0 v_y G_y t_6 t_7 \\ \text{(iii)} & -\theta_z = 0.36\, v_0 v_z G_z t_3 t_3 \end{array}\right\} \quad (5)$$

where $t_6$ and $t_7$ are periods of time indicated in FIG. 1.

In the z-direction phase variations of $-\theta_z$ are produced by the flow encoded pulse $G_z$ 108. However, since $\theta_z$ has been varied, finally $\theta_z$ becomes zero. In the x-direction the two encoded pulses $G_z$ 114 and 115 are cancelled by each other and thus no phase variations are produced. In the y-direction $G_y$ 110 and 111 are flow encoded pulses and phase variations $\theta_y$ are produced. Finally the following result can be obtained.

$$\left.\begin{array}{ll} x\text{-direction:} & 0 + 0 = 0 \\ y\text{-direction:} & 0 + \theta_y = \theta_y \\ z\text{-direction:} & \theta_z - \theta_z = 0 \end{array}\right\} \quad (6)$$

In this way, since the phase variations $\theta_y$ in the y-direction can be measured, the speed component $v_y$ can be obtained by using (ii) of the Eq. (5) stated above.

A table summarizing the above discussion is indicated in FIG. 2.

In this way it is possible to obtain a three-dimensional velocity of the blood flowing in a vein in an arbitrary direction by effecting imaging on the basis of the sequence indicated in FIG. 1 and calculating the phase.

Furthermore it is also possible to change the dynamic range of the measured speed by modifying a little the sequence indicated in FIG. 1.

Figure 3:
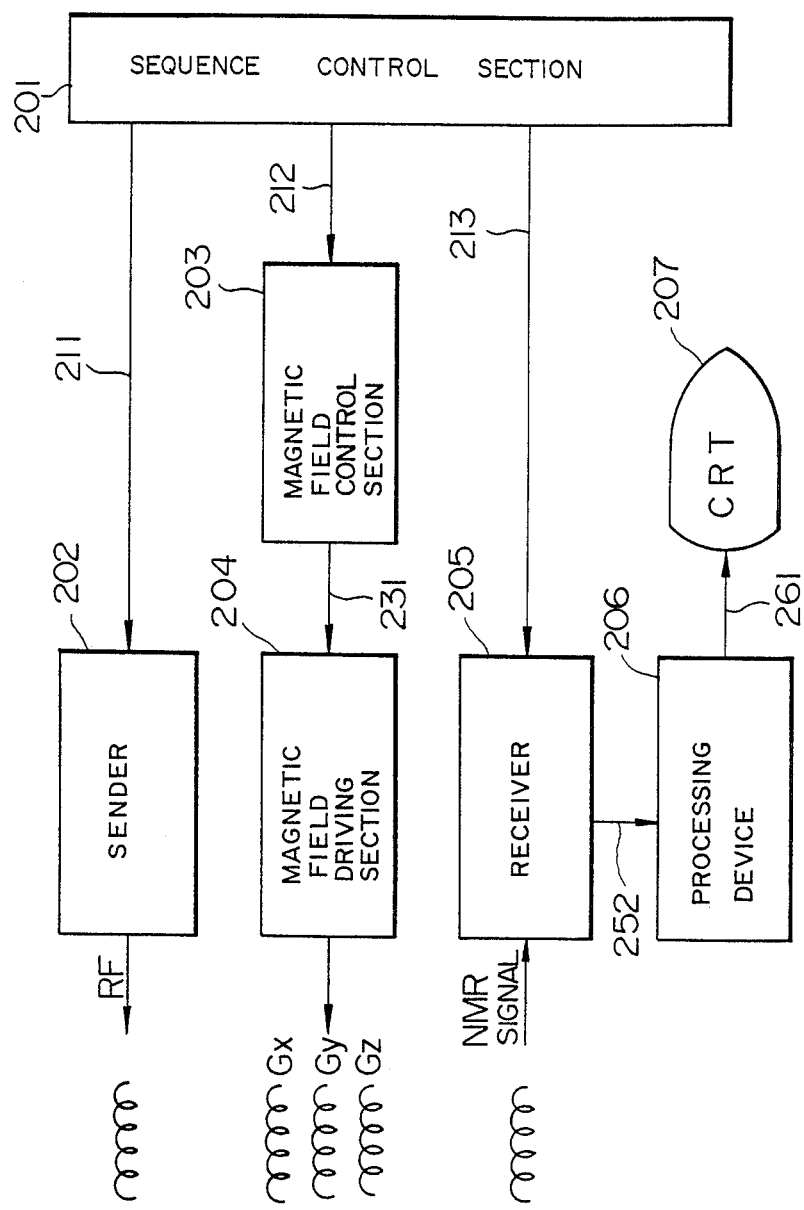
FIG. 3 is a block diagram illustrating the construction of a device for realizing an embodiment of this invention.

FIG. 3 is a block diagram illustrating the contruction of a device for realizing an embodiment of this invention. In the figure a sequence control section 201 controls various kinds of pulses and magnetic fields generated for the purpose of detecting an NMR signal from an examined object. A sender 202 generates a high frequency pulse train RF to make a specified nuclide resonate in the examined object on the basis of a signal 211 coming from the sequence control section 201. A magnetic field control section 203 generates a gradient magnetic field control signal 231, which can control the intensity and the direction of the static magnetic field deciding the resonance frequency of the NMR signal on the basis of a signal 212 coming from the sequence control section 201. A magnetic field driving section 204 generates the gradient magnetic fields $G_x$, $G_y$ and $G_z$ necessary for the measurement on the basis of this control signal 231. A receiver 205 is controlled by a signal 213 coming from the sequence control section 201 after having detected the NMR signal produced by the examined object and outputs a measured signal 252. On the basis thereof a processing device 206 carries out the reconstruction of the image and various operations and sends a reconstructed image signal 261 to a CRT 207 to display it thereon.

FIG. 4 is a flow chart indicating the treatment procedure for realizing this invention.

At Step 301, according to the pulse sequence indicated in FIG. 1, the phase encoded gradient magnetic field $G_y$ 109 is generated on the basis of the control signal outputted by the sequence control section 201 in FIG. 2 and further following Steps 302-304 are repeated a number of times necessary for the image reconstruction.

At Step 302 the first echo signal 116 is measured.
At Step 303 the second echo signal 117 is measured.
At Step 304 the third echo signal 118 is measured.
At Step 305 phase variations produced by distorsions in respective devices in the 3 echo signals 116, 117 and 118 are corrected and the image is reconstructed. Among the distorsions influencing the phase there are;
  (i) shift of the positional origin of the sample of the NMR signal,
  (ii) characteristics of the detection system, and
  (iii) inhomogeneity of the static magnetic field.
This correction can be effected by a method, which is already known [Sano et al.: Phase Correction Technique in MRI, General National Meeting of The Institute of Electronics and Communication Engineers of Japan, 1985] Related techniques are described also in U.S. patent application Ser. No. 869,976, filed on June 2, 1986 "Magnetic Resonance Imaging Method" now U.S. Pat. No. 4,724,388. The image is reconstructed, while effecting these corrections.

In this example, since echo signals up to the third one, 3 sorts of images are obtained. Each of the images can be represented by a complex signal given by the following equation.

$$f_K(x_1, y) = \rho(x,y) \exp\left(-\frac{k \cdot T_E}{T_2(x,y)}\right) \exp(i\theta_K(x,y))$$

where $f_K(x, y)$: density of a pixel (x, y) reproduced from the k-th echo signal.

$\rho(x, y)$: spin density $T_E$: echo time (interval between two adjacent 180° pulses in FIG. 1)

$T_2(x, y)$: transverse relaxation time $\theta_K(x, y)$: variations in the phase depending on the flow speed.

$\theta_1$ = proportional to the velocity in the x-direction
$\theta_2$ = proportional to the velocity in the z-direction
$\theta_3$ = proportional to the velocity in the y-direction By the method described above variations in the phase of each of the images can be calculated.

At Step 306 the speed components $v_x$, $v_z$ and $v_y$ are calculated by means of Eqs. (i) of (1), (ii) of (3) and (ii) of (5), respectively, by using these calculated variations in the phase.

As explained above, according to this invention, it is possible to measure the speed of the blood flow in a vein in an arbitrary direction by one imaging by measuring three echo signals. Therefore effects can be obtained that deterioration in the image quality and in the precision due to movements of the patient is small with respect to the prior art method, by which imaging must be repeated a plurality of times, that not only the vein but also the cardiac wall, which effect 3-dimensional movements, can be observed, that since only one imaging is sufficient, it is possible to obtain a high throughput, etc.

We claim:

1. A single sequence method for imaging a three-dimensional moving object in an examined object located in a predetermined magnetic field comprising the following steps of:
    (a) generating a high frequency pulse train used for exciting hydrogen spin in the examined object;
    (b) generating gradient magnetic fields in three orthogonal directions, which are utilized for measuring the speed of the moving object in the examined object;
    (c) generating a 180° pulse a plurality of times for obtaining echo signals with respect to nuclear magnetic resonance signal produced by said high frequency pulse train;
    (d) measuring variations in the phase in said three orthogonal directions on the basis of multi-echo signals obtained by said 180° pulses; and
    (e) obtaining speed components in the phase in said three orthogonal directions of said moving object on the basis of the measured variations in the phase.

2. A method for imaging a three-dimensional moving object according to claim 1, further comprising a step of correcting phase distortions of said echo signals.

3. A method for imaging a three-dimensional moving object in an examined object located in a predetermined magnetic field comprising the following steps of:
    (a) generating a high frequency pulse train used for exciting hydrogen spin in the examined object;
    (b) generating gradient magnetic fields in three orthogonal directions, which are utilized for measuring the speed of the moving object in the examined object;
    (c) generating a 180° pulse a plurality of times for obtaining echo signals with respect to nuclear magnetic resonance signal produced by said high frequency pulse train;
    (d) measuring variations in the phase in one of said three orthogonal directions on the basis of multi-echo signals obtained by said 180° pulse;
    (e) repeating said steps (b)–(d) a predetermined number of times to measure variations in the phase in the other orthogonal directions; and
    (f) obtaining speed components in the phase in said three orthogonal directions of said moving object on the basis of the measured variations in the phase.

4. A method for imaging a three-dimensional moving object according to claim 3, further comprising a step of correcting phase distortions of said echo signals.

* * * * *